United States Patent
Yeon et al.

(10) Patent No.: US 11,183,446 B1
(45) Date of Patent: Nov. 23, 2021

(54) X.5 LAYER SUBSTRATE

(71) Applicant: QUALCOMM Incorporated, San Diego, CA (US)

(72) Inventors: Jaehyun Yeon, San Diego, CA (US); Suhyung Hwang, Rancho Mission Viejo, CA (US); Hong Bok We, San Diego, CA (US); Kun Fang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/994,910

(22) Filed: Aug. 17, 2020

(51) Int. Cl.
| | |
|---|---|
| *H05K 1/02* | (2006.01) |
| *H01L 23/498* | (2006.01) |
| *H05K 1/11* | (2006.01) |
| *H05K 3/40* | (2006.01) |
| *H05K 3/10* | (2006.01) |

(52) U.S. Cl.
CPC ......... *H01L 23/49811* (2013.01); *H01L 23/49822* (2013.01); *H05K 1/0296* (2013.01); *H05K 1/111* (2013.01); *H05K 3/4007* (2013.01); *H05K 3/10* (2013.01); *H05K 2201/2081* (2013.01)

(58) Field of Classification Search
CPC .... H05K 1/0296; H05K 1/111; H05K 3/4007; H05K 3/10
USPC .......................................... 174/251
See application file for complete search history.

(56) References Cited

U.S. PATENT DOCUMENTS

| | | | |
|---|---|---|---|
| 2015/0364394 A1 | 12/2015 | Lin | |
| 2016/0338202 A1 | 11/2016 | Park et al. | |
| 2017/0133309 A1 | 5/2017 | Kim et al. | |
| 2017/0278766 A1 | 9/2017 | Kim et al. | |
| 2017/0287825 A1* | 10/2017 | Lee | H01L 21/56 |
| 2018/0138114 A1* | 5/2018 | Lee | H01L 23/3192 |
| 2018/0190581 A1 | 7/2018 | Lin | |
| 2018/0240743 A1* | 8/2018 | Lee | H01L 21/486 |

* cited by examiner

*Primary Examiner* — Sherman Ng
(74) *Attorney, Agent, or Firm* — Muncy, Geissler, Olds & Lowe, P.C.

(57) ABSTRACT

X.5 layer substrates that do not use an embedded traces substrate process during formation may produce a high yield with relaxed L/S in a short manufacturing time (only 4× lamination process without a detach process) at a low cost. For example, a substrate may include an mSAP, two landing pads, two escape lines, two bump pads, and a photo-imageable dielectric layer on the mSAP patterned substrate.

28 Claims, 6 Drawing Sheets

X.5 LAYER SUBSTRATE

FIELD OF DISCLOSURE

This disclosure relates generally to substrates, and more specifically, but not exclusively, to fan-out substrates.

BACKGROUND

Modern substrate electronics are becoming more prevalent and subject to increasing demands for reduced cost and size. One approach is the use of a fan-out substrate. Fan-Out packaging continues to gain prominence within the industry, based on significant technical advantages that have led to its broad commercialization. "Fan-Out" packaging can be defined as any package with connections fanned-out of the chip surface, enabling more external I/Os. Conventional fan-out packages use an epoxy mold compound to fully embed the dies, rather than placing them upon a substrate or interposer. Fan-Out packaging typically involves dicing chips on a silicon wafer, and then very precisely positioning the known-good chips on a thin "reconstituted" or carrier wafer/panel, which is then molded and followed by a redistribution layer (RDL) atop the molded area (chip and fan-out area), and then forming solder balls on top. In one technique, a standard Fan-Out type RDL includes dies embedded in materials such as an organic laminate or silicon wafer instead of the mold compound. Fan-Out is a wafer-level packaging (WLP) technology. It is essentially a true chip-scale packaging (CSP) technology since the resulting package is roughly the same size as the die itself.

To meet the signal fan-out requirement of high layer-count module products with bare die attached, a ten layer embedded trace substrate (10L ETS) may be used. However, 10L ETS have several problems including, but not limited to:

(a) Long Manufacturing Time: 9-time Lamination Process+Carrier Detach;
(b) High Warpage: ETS Layer takes stress 9 times during lamination;
(c) Low Yield: Cu Pattern and SR Damage caused by Handling 20 Layer Thick Panel in the Rolling Machine;
(d) Extremely low yield: Short and Open issues caused by Fine Trace line/spacing (L/S) (e.g., 8 um/10 um) needed for 90 um pitch with at least two escape lines; and
(e) High Cost: Caused by all issues mentioned above.

Accordingly, there is a need for systems, apparatus, and methods that overcome the deficiencies of conventional approaches.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a substrate comprises: a modified semi-additive process (mSAP) patterned substrate; a first landing pad on a first side of the mSAP patterned substrate; a second landing pad on the first side of the mSAP patterned substrate proximate to the first landing pad; a first escape line on the first side of the mSAP patterned substrate between the first landing pad and the second landing pad; a second escape line on the first side of the mSAP patterned substrate proximate to the first escape line between the first landing pad and the second landing pad; a photo-imageable dielectric layer on the first side of the mSAP patterned substrate, the dielectric layer configured to encapsulate the first escape line and the second escape line; a first bump pad on the dielectric layer opposite the mSAP patterned substrate, the first bump pad extending through the dielectric layer to the first landing pad; and a second bump pad on the dielectric layer opposite the mSAP patterned substrate, the second bump pad extending through the dielectric layer to the second landing pad.

In another aspect, a substrate comprises: means for support; a first landing pad on a first side of the means for support; a second landing pad on the first side of the means for support proximate to the first landing pad; a first escape line on the first side of the means for support between the first landing pad and the second landing pad; a second escape line on the first side of the means for support proximate to the first escape line between the first landing pad and the second landing pad; means for insulation on the first side of the means for support, the means for insulation configured to encapsulate the first escape line and the second escape line; a first bump pad on the means for insulation opposite the means for support, the first bump pad extending through the means for insulation to the first landing pad; and a second bump pad on the means for insulation opposite the means for support, the second bump pad extending through the means for insulation to the second landing pad.

In still another aspect, a method for manufacturing a substrate comprises: providing a modified semi-additive process (mSAP) patterned substrate; forming a first landing pad on a first side of the mSAP patterned substrate; forming a second landing pad on the first side of the mSAP patterned substrate proximate to the first landing pad; forming a first escape line on the first side of the mSAP patterned substrate between the first landing pad and the second landing pad; forming a second escape line on the first side of the mSAP patterned substrate proximate to the first escape line between the first landing pad and the second landing pad; forming a photo-imageable dielectric layer on the first side of the mSAP patterned substrate, the dielectric layer configured to encapsulate the first escape line and the second escape line; forming a first bump pad on the dielectric layer opposite the mSAP patterned substrate, the first bump pad extending through the dielectric layer to the first landing pad; and forming a second bump pad on the dielectric layer opposite the mSAP patterned substrate, the second bump pad extending through the dielectric layer to the second landing pad.

In still another aspect, a non-transitory computer-readable medium comprising instructions that when executed by a processor cause the processor to perform a method comprising: providing a modified semi-additive process (mSAP) patterned substrate; forming a first landing pad on a first side of the mSAP patterned substrate; forming a second landing pad on the first side of the mSAP patterned substrate proximate to the first landing pad; forming a first escape line on the first side of the mSAP patterned substrate between the first landing pad and the second landing pad; forming a second escape line on the first side of the mSAP patterned substrate proximate to the first escape line between the first landing pad and the second landing pad; forming a photo-imageable dielectric layer on the first side of the mSAP patterned substrate, the dielectric layer configured to encapsulate the first escape line and the second escape line; forming a first bump pad on the dielectric layer opposite the mSAP patterned substrate, the first bump pad extending through the dielectric layer to the first landing pad; and forming a second bump pad on the dielectric layer opposite the mSAP patterned substrate, the second bump pad extending through the dielectric layer to the second landing pad.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
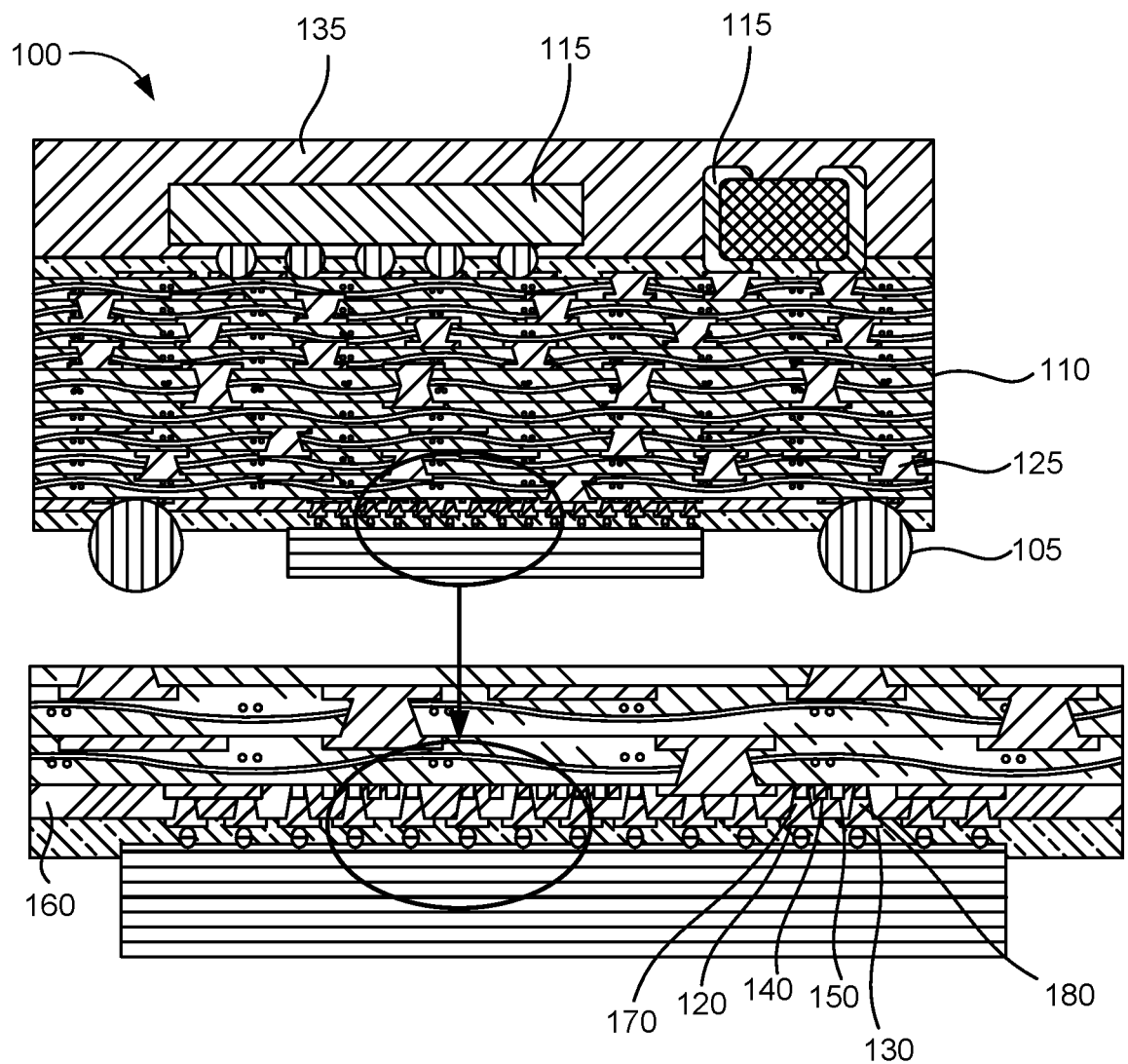
FIG. 1 illustrates an exemplary substrate in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Examples herein include X.5 Layer substrates that do not use an embedded traces substrate process during formation that produce a high yield with relaxed L/S in a short manufacturing time (only 4× lamination process without a detach process) at a low cost. Examples also include substrates that (1) do not require an ETS process; (2) provide high yield with relaxed L/S using a modified semi-additive process (mSAP) instead of a very fine L/S ETS; (3) have a short manufacturing time with only 4-time lamination process without an additional detach process; and (4) are manufactured at a lower cost.

FIG. 1 illustrates an exemplary substrate in accordance with some examples of the disclosure. As shown in FIG. 1, a substrate 100 may include a modified semi-additive process (mSAP) patterned substrate 110; a first landing pad 120 on a first side of the mSAP patterned substrate 110; a second landing pad 130 on the first side of the mSAP patterned substrate 110 proximate to the first landing pad 120; a first escape line 140 on the first side of the mSAP patterned substrate 110 between the first landing pad 120 and the second landing pad 130; a second escape line 150 on the first side of the mSAP patterned substrate 110 proximate to the first escape line 140 between the first landing pad 120 and the second landing pad 130; a photo-imageable dielectric layer 160 on the first side of the mSAP patterned substrate 110, the photo-imageable dielectric layer 160 configured to encapsulate the first escape line 140 and the second escape line 150; a first bump pad 170 on the photo-imageable dielectric layer 160 opposite the mSAP patterned substrate 110, the first bump pad 170 extending through the photo-imageable dielectric layer 160 to the first landing pad 120; and a second bump pad 180 on the photo-imageable dielectric layer 160 opposite the mSAP patterned substrate 110, the second bump pad 180 extending through the photo-imageable dielectric layer 160 to the second landing pad 130.

As shown in FIG. 1, the substrate 100 may also include a plurality of external connections 105 (e.g., solder balls configured in a ball grid array or a land side grid array), one or more devices 115 such as active (e.g., logic die or integrated circuit) or passive (e.g., capacitor, inductor, etc.) embedded in, on top of, or on the bottom of the mSAP patterned substrate 110, a metallization structure 125 (e.g., redistribution layer) in or on the mSAP patterned substrate 110, and a mold compound 135 on the mSAP patterned substrate 110 in addition to other conventional aspects of an electronics package. It should be understood that the photo-imageable dielectric layer 160 may be approximately half the size (or height from a side perspective) of a standard lamination layer used in a conventional 10 layer, for example, mSAP built substrate. Thus, the substrate 100 may include 10L with a 0.5 L dielectric that does not need an ETS process, uses relaxed L/S (mSAP) instead of very fine L/S (ETS) and reduces the manufacturing time by using only a 4× lamination process without a ball detach process at a lower cost than conventional mSAP substrates.

Figure 2A:
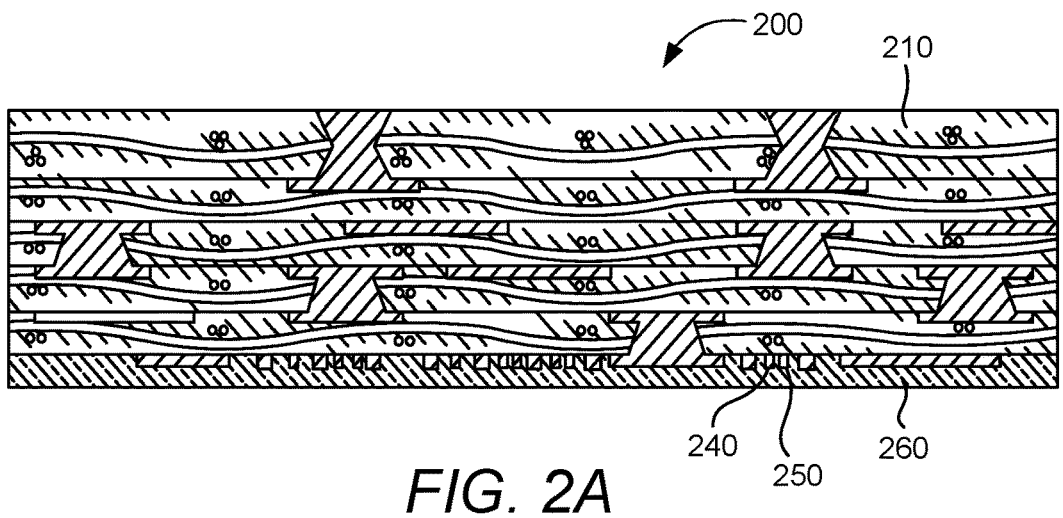
FIGS. 2A-C illustrate an exemplary method for manufacturing a substrate in accordance with some examples of the disclosure.
Figure 2B:
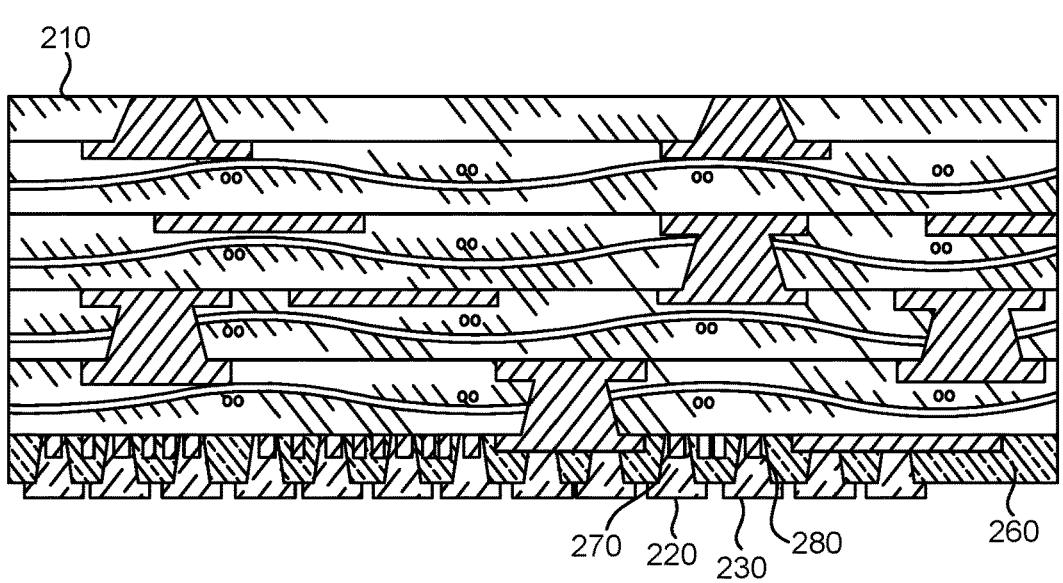
Figure 2C:
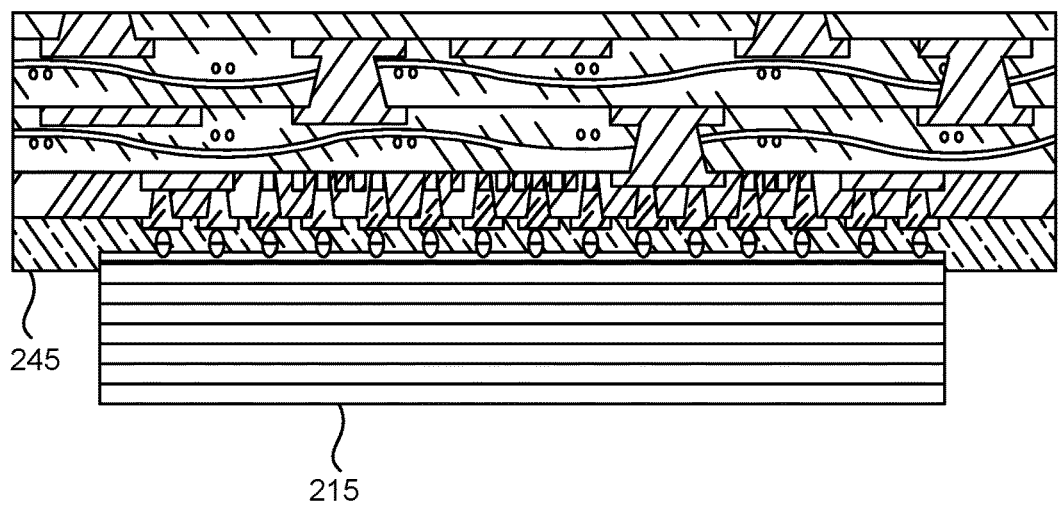

FIGS. 2A-C illustrate an exemplary method for manufacturing a substrate in accordance with some examples of the disclosure. As shown in FIG. 2A, a method 200 of manufacturing a substrate (e.g., substrate 100) may begin with forming a mSAP patterned substrate 210 with 10 layers of laminated prepreg (may also include embedded devices, vias, and metallization structures) and a half layer of dielectric to form a dielectric layer 260. The method 200 may include forming a first escape line 240 and a second escape line 250 in the dielectric layer 260 on one side of the mSAP patterned substrate 210. As shown in FIG. 2B, the method 200 may continue with forming: a first landing pad 220 on a first side of the mSAP patterned substrate 210; a second landing pad 230 on the first side of the mSAP patterned substrate 210 proximate to the first landing pad 220; a first bump pad 270 on the dielectric layer 260 opposite the mSAP patterned substrate 210, the first bump pad 270 extending through the dielectric layer 260 to the first landing pad 220; and a second bump pad 280 on the dielectric layer 260 opposite the mSAP patterned substrate 210, the second bump pad 280 extending through the dielectric layer 260 to the second landing pad 230. This may be accomplished in a number of ways including performing laser drilling or exposing a photo-imageable dielectric (PID) to uncover specific trace/pad, via plating and, pad patterning. As shown in FIG. 2C, the method 200 may conclude with forming a solder resist layer 245 and attaching one or more devices 215 (e.g., a flip chip or similar).

Figure 3:
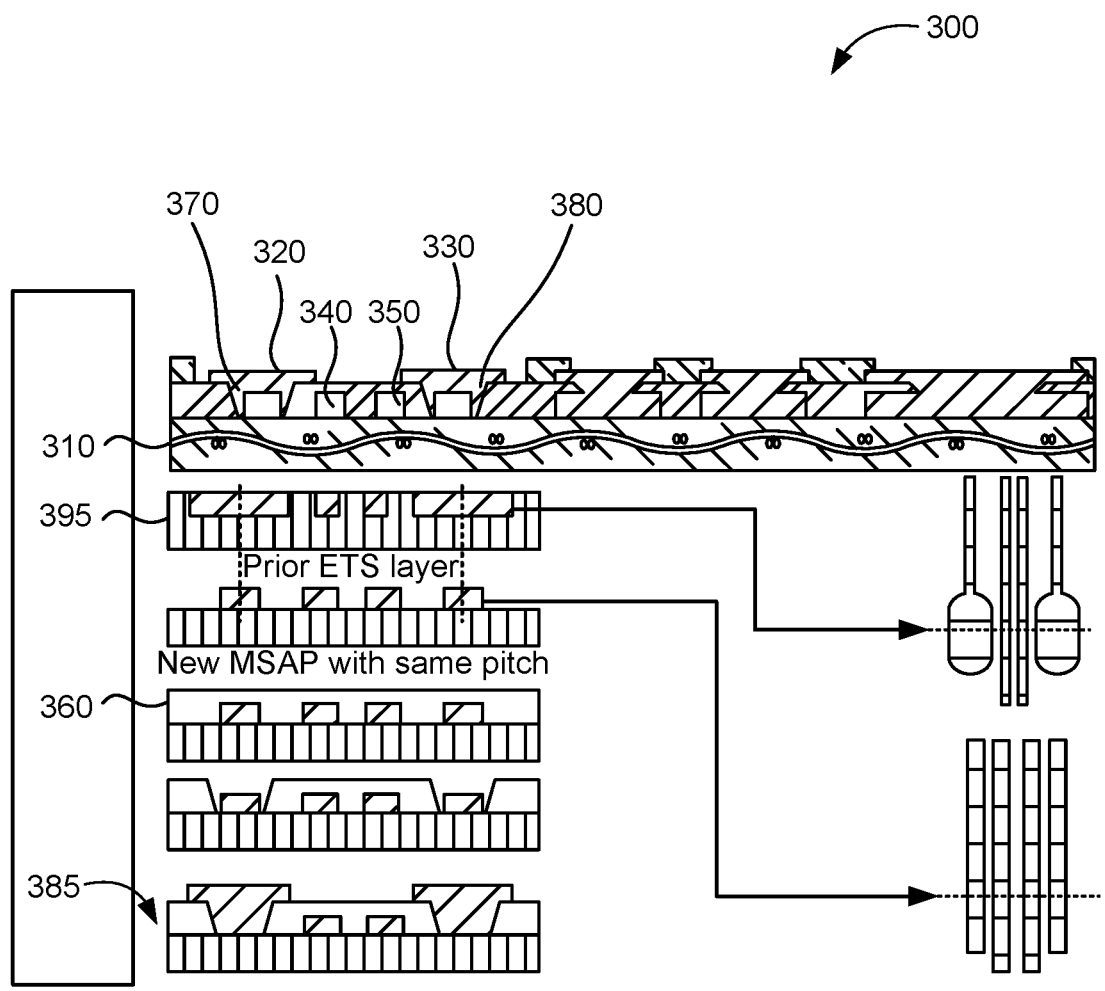
FIG. 3 illustrates an exemplary substrate and process in accordance with some examples of the disclosure.

FIG. 3 illustrates an exemplary substrate and process 300 in accordance with some examples of the disclosure. As shown in FIG. 3, a mSAP patterned substrate 310 (e.g., substrate 110, substrate 210) may include a first landing pad 320 on a first side of the mSAP patterned substrate 310; a second landing pad 330 on the first side of the mSAP patterned substrate 310 proximate to the first landing pad 320; a first escape line 340 on the first side of the mSAP patterned substrate 310 between the first landing pad 320 and the second landing pad 330; a second escape line 350 on the first side of the mSAP patterned substrate 310 proximate to the first escape line 340 between the first landing pad 320 and the second landing pad 330; a photo-imageable dielectric layer 360 on the first side of the mSAP patterned substrate 310, the photo-imageable dielectric layer 360 configured to encapsulate the first escape line 340 and the second escape line 350; a first bump pad 370 on the photo-imageable dielectric layer 360 opposite the mSAP patterned substrate 310, the first bump pad 370 extending through the photo-imageable dielectric layer 360 to the first landing pad 320; and a second bump pad 380 on the photo-imageable dielectric layer 360 opposite the mSAP patterned substrate 310, the second bump pad 380 extending through the photo-imageable dielectric layer 360 to the second landing pad 330. As shown in FIG. 3, a conventional ETS layer 395 configuration shows the very fine line/space restrictions (8 µm/10 µm) needed for 90 um pitch with two escapes lines. As shown in the conventional ETS layer 395 configuration (w/2 escape lines), the surfaces are co-planar and each bump pad has a width of approximately 44 µm, a spacing of approximately 10 µm between the edge of the co-planar bump pad and an escape line as well as between proximate escape lines with each escape having a width of approximately 8 µm. However, as shown in the structure 385, a more relaxed L/S are achieved with non-coplanar structures as shown. This allows more spacing between traces and wider traces in the same 90 µm pitch with two escape lines within the photo-imageable dielectric layer 360. For example, the first escape line 340, the second escape line 350, the first bump pad 370, and the second bump pad 380 may be co-planar. In another example, the first escape line 340 and the second escape line 350 may be co-planar in a first plane, and the first landing pad 320 and the second landing pad 330 are co-planar in a second plane different from the first plane. In addition, the photo-imageable dielectric layer 360 may also separate a fine L/S region from a solder connection region in a solder layer (not shown) and, alternatively, the photo-imageable dielectric layer 360 does not contain any reinforcement material or prepreg material making the manufacturing process easier and less costly.

Figure 4:
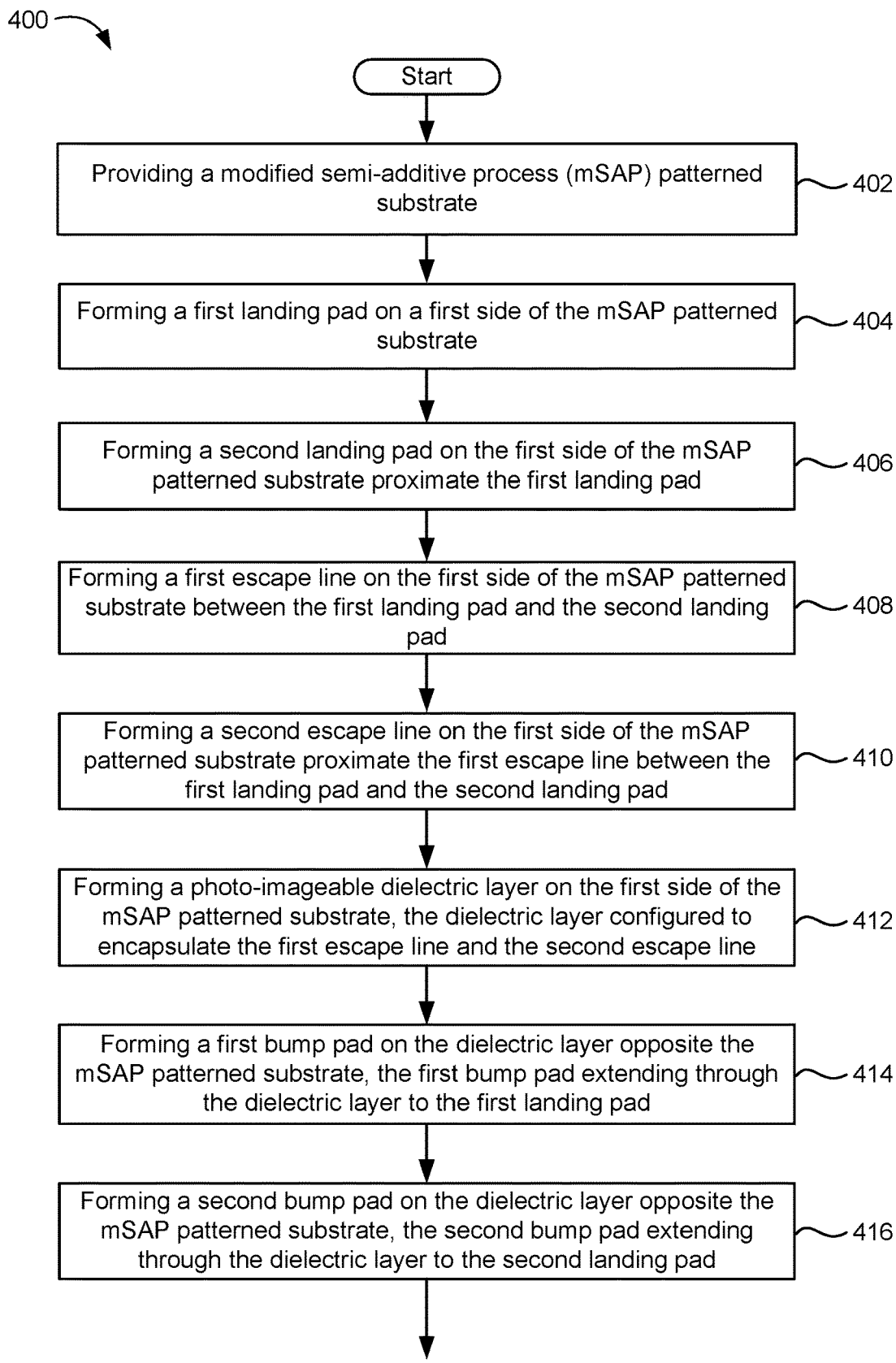
FIG. 4 illustrates an exemplary method in accordance with some examples of the disclosure.

FIG. 4 illustrates an exemplary method in accordance with some examples of the disclosure. As shown in FIG. 4, the method 400 may begin in block 402 with providing an mSAP patterned substrate. The method 400 may continue in block 404 with forming a first landing pad on a first side of the mSAP patterned substrate. The method 400 may continue in block 406 with forming a second landing pad on the first side of the mSAP patterned substrate proximate to the first landing pad. The method 400 may continue in block 408 with forming a first escape line on the first side of the mSAP patterned substrate between the first landing pad and the second landing pad. The method 400 may continue in block 410 with forming a second escape line on the first side of the mSAP patterned substrate proximate to the first escape line between the first landing pad and the second landing pad. The method 400 may continue in block 412 with forming a photo-imageable dielectric layer on the first side of the mSAP patterned substrate, the dielectric layer configured to encapsulate the first escape line and the second escape line. The method 400 may continue in block 414 with forming a first bump pad on the dielectric layer opposite the mSAP patterned substrate, the first bump pad extending through the dielectric layer to the first landing pad. The method 400 may conclude in block 416 with forming a second bump pad on the dielectric layer opposite the mSAP patterned substrate, the second bump pad extending through the dielectric layer to the second landing pad.

Alternatively, the method 400 may include forming a solder resist film on the dielectric layer, the solder resist film configured to encapsulate the first bump pad and the second bump pad; wherein the first escape line, the second escape line, the first landing pad, and the second landing pad are co-planar; wherein the first escape line and the second escape line are co-planar in a first plane, and the first bump pad and the second bump pad are co-planar in a second plane different from the first plane; wherein the dielectric layer separates a fine L/S region from a solder connection region; wherein the dielectric layer does not contain any reinforcement material or prepreg material; and incorporating the substrate into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Figure 5:
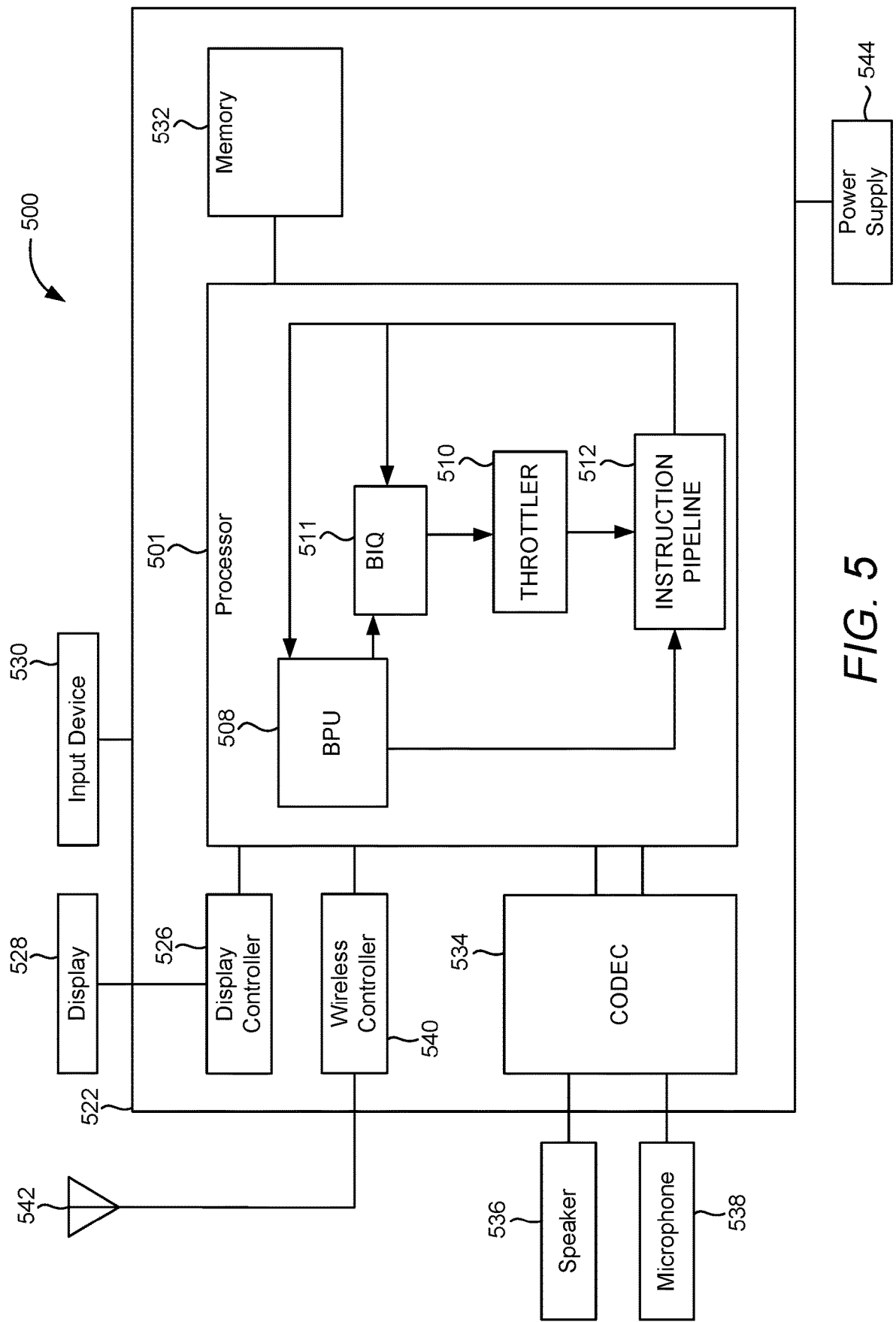
FIG. 5 illustrates an exemplary mobile device in accordance with some examples of the disclosure.

FIG. 5 illustrates an exemplary mobile device in accordance with some examples of the disclosure. Referring now to FIG. 5, a block diagram of a mobile device that is configured according to exemplary aspects is depicted and generally designated 500. In some aspects, mobile device 500 may be configured as a wireless communication device. As shown, mobile device 500 includes processor 501, which may be configured to implement the methods described herein in some aspects. Processor 501 is shown to comprise instruction pipeline 512, buffer processing unit (BPU) 508, branch instruction queue (BIQ) 511, and throttler 510 as is well known in the art. Other well-known details (e.g., counters, entries, confidence fields, weighted sum, comparator, etc.) of these blocks have been omitted from this view of processor 501 for the sake of clarity.

Processor 501 may be communicatively coupled to memory 532 over a link, which may be a die-to-die or chip-to-chip link. Mobile device 500 also include display 528 and display controller 526, with display controller 526 coupled to processor 501 and to display 528.

In some aspects, FIG. 5 may include coder/decoder (CODEC) 534 (e.g., an audio and/or voice CODEC) coupled to processor 501; speaker 536 and microphone 538 coupled to CODEC 534; and wireless controller 540 (which may include a modem) coupled to wireless antenna 542 and to processor 501.

In a particular aspect, where one or more of the above-mentioned blocks are present, processor 501, display controller 526, memory 532, CODEC 534, and wireless controller 540 can be included in a system-in-package or system-on-chip device 522. Input device 530 (e.g., physical or virtual keyboard), power supply 544 (e.g., battery), display 528, input device 530, speaker 536, microphone 538, wireless antenna 542, and power supply 544 may be external to system-on-chip device 522 and may be coupled to a component of system-on-chip device 522, such as an interface or a controller.

It should be noted that although FIG. 5 depicts a mobile device, processor 501 and memory 532 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
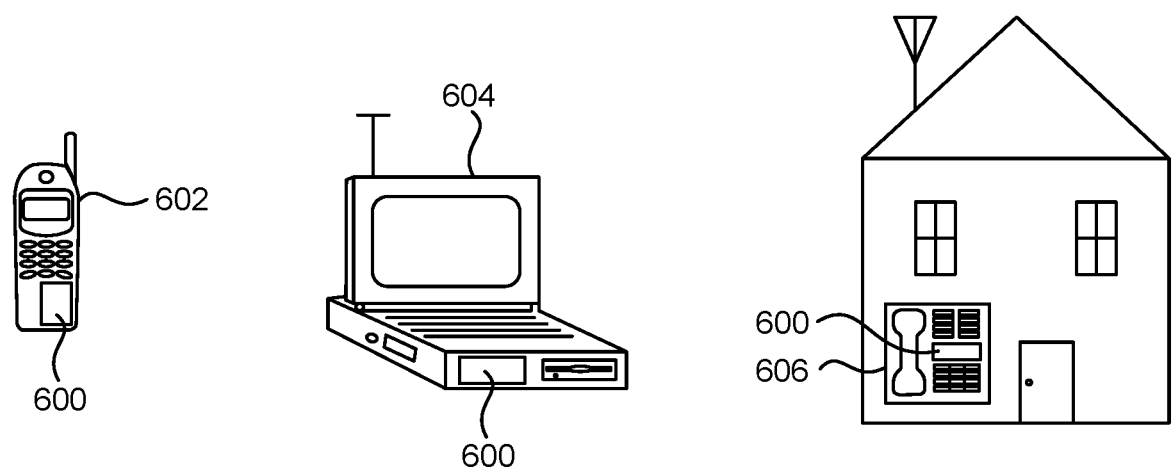
FIG. 6 illustrates various electronic devices that may be integrated with any of the aforementioned methods, devices, semiconductor devices, integrated circuits, die, interposers, packages, or package-on-packages (PoPs) in accordance with some examples of the disclosure.

FIG. 6 illustrates various electronic devices that may be integrated with any of the aforementioned integrated device, semiconductor device, integrated circuit, die, interposer, package or package-on-package (PoP) in accordance with some examples of the disclosure. For example, a mobile phone device 602, a laptop computer device 604, and a fixed location terminal device 606 may include an integrated device 600 as described herein. The integrated device 600 may be, for example, any of the integrated circuits, dies, integrated devices, integrated device packages, integrated circuit devices, device packages, integrated circuit (IC) packages, package-on-package devices described herein. The devices 602, 604, 606 illustrated in FIG. 6 are merely exemplary. Other electronic devices may also feature the integrated device 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, a substrate (e.g., substrate 100) may comprises: means for support (e.g., a mSAP patterned substrate); a first landing pad on a first side of the means for support; a second landing pad on the first side of the means for support proximate to the first landing pad; a first escape line on the first side of the means for support between the first landing pad and the second landing pad; a second escape line on the first side of the means for support proximate to the first escape line between the first landing pad and the second landing pad; means for insulation (e.g., a dielectric layer) on the first side of the means for support, the means for insulation configured to encapsulate the first escape line and the second escape line; a first bump pad on the means for insulation opposite the means for support, the first bump pad extending through the means for insulation to the first landing pad; and a second bump pad on the means for insulation opposite the means for support, the second bump pad extending through the means for insulation to the second landing pad. It will be appreciated that the aforementioned aspects are merely provided as examples and the various aspects claimed are not limited to the specific references and/or illustrations cited as examples.

One or more of the components, processes, features, and/or functions illustrated in FIGS. 1-6 may be rearranged and/or combined into a single component, process, feature or function or incorporated in several components, processes, or functions. Additional elements, components, processes, and/or functions may also be added without departing from the disclosure. It should also be noted that FIGS. 1-6 and its corresponding description in the present disclosure is not limited to dies and/or ICs. In some implementations, FIGS. 1-6 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g. transistors, resistors, capacitors, inductors etc.), which perform the operation or function of the device. The backside of a device is the side of the device opposite the active side. As used herein, a metallization structures may include metal layers, vias, pads, or traces with dielectric between, such as a redistribution layer or RDL).

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wire line connection, or other connection, regardless of whether satellite signal reception, assistance data reception, and/or position-related processing occurs at the device or at the other device. In addition, these terms are intended to include all devices, including wireless and wire line communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wire line phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation.

Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A substrate comprising:
   a modified semi-additive process (mSAP) patterned substrate;
   a first landing pad on a first side of the mSAP patterned substrate;
   a second landing pad on the first side of the mSAP patterned substrate proximate to the first landing pad;
   a first escape line on the first side of the mSAP patterned substrate between the first landing pad and the second landing pad;
   a second escape line on the first side of the mSAP patterned substrate proximate to the first escape line between the first landing pad and the second landing pad;
   a photo-imageable dielectric layer on the first side of the mSAP patterned substrate, the photo-imageable dielectric layer configured to encapsulate the first escape line and the second escape line;
   a first bump pad on the photo-imageable dielectric layer opposite the mSAP patterned substrate, the first bump pad extending through the photo-imageable dielectric layer to the first landing pad; and
   a second bump pad on the photo-imageable dielectric layer opposite the mSAP patterned substrate, the second bump pad extending through the photo-imageable dielectric layer to the second landing pad,
   wherein a first line, a second line, the first escape line and the second escape line are co-planar in a first plane, and the first landing pad and the second landing pad are co-planar in a second plane different from the first plane, and wherein the first landing pad is coupled to the first line and the second landing pad is coupled to the second line.

2. The substrate of claim 1, further comprising a solder resist film on the photo-imageable dielectric layer, the solder resist film configured to encapsulate the first bump pad and the second bump pad.

3. The substrate of claim 1, wherein the first escape line, the second escape line, the first bump pad, and the second bump pad are co-planar.

4. The substrate of claim 1, wherein the first line, the second line, the first escape line and the second escape line have a same line spacing in the first plane.

5. The substrate of claim 1, wherein the photo-imageable dielectric layer separates a fine line/spacing, L/S, region from a solder connection region.

6. The substrate of claim 1, wherein the photo-imageable dielectric layer does not contain any reinforcement material or prepreg material.

7. The substrate of claim 1, wherein the substrate is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

8. A substrate comprising:
   means for support;
   a first landing pad on a first side of the means for support;
   a second landing pad on the first side of the means for support proximate to the first landing pad;
   a first escape line on the first side of the means for support between the first landing pad and the second landing pad;
   a second escape line on the first side of the means for support proximate to the first escape line between the first landing pad and the second landing pad;
   means for insulation on the first side of the means for support, the means for insulation configured to encapsulate the first escape line and the second escape line;
   a first bump pad on the means for insulation opposite the means for support, the first bump pad extending through the means for insulation to the first landing pad; and
   a second bump pad on the means for insulation opposite the means for support, the second bump pad extending through the means for insulation to the second landing pad,
   wherein a first line, a second line, the first escape line and the second escape line are co-planar in a first plane, and the first landing pad and the second landing pad are co-planar in a second plane different from the first plane, and wherein the first landing pad is coupled to the first line and the second landing pad is coupled to the second line.

9. The substrate of claim 8, further comprising a solder resist film on the means for insulation, the solder resist film configured to encapsulate the first bump pad and the second bump pad.

10. The substrate of claim 8, wherein the first escape line, the second escape line, the first bump pad, and the second bump pad are co-planar.

11. The substrate of claim 8, wherein the first line, the second line, the first escape line and the second escape line have a same line spacing in the first plane.

12. The substrate of claim 8, wherein the means for insulation separates a fine line/spacing, L/S, region from a solder connection region.

13. The substrate of claim 8, wherein the means for insulation does not contain any reinforcement material or prepreg material.

14. The substrate of claim 8, wherein the substrate is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

15. A method for manufacturing a substrate, the method comprising:
   providing a modified semi-additive process (mSAP) patterned substrate;
   forming a first landing pad on a first side of the mSAP patterned substrate;

forming a second landing pad on the first side of the mSAP patterned substrate proximate to the first landing pad;

forming a first escape line on the first side of the mSAP patterned substrate between the first landing pad and the second landing pad;

forming a second escape line on the first side of the mSAP patterned substrate proximate to the first escape line between the first landing pad and the second landing pad;

forming a photo-imageable dielectric layer on the first side of the mSAP patterned substrate, the photo-imageable dielectric layer configured to encapsulate the first escape line and the second escape line;

forming a first bump pad on the photo-imageable dielectric layer opposite the mSAP patterned substrate, the first bump pad extending through the photo-imageable dielectric layer to the first landing pad; and forming a second bump pad on the photo-imageable dielectric layer opposite the mSAP patterned substrate, the second bump pad extending through the photo-imageable dielectric layer to the second landing pad, wherein a first line, a second line, the first escape line and the second escape line are co-planar in a first plane, and the first landing pad and the second landing pad are co-planar in a second plane different from the first plane, and wherein the first landing pad is coupled to the first line and the second landing pad is coupled to the second line.

16. The method of claim 15, further comprising forming a solder resist film on the photo-imageable dielectric layer, the solder resist film configured to encapsulate the first bump pad and the second bump pad.

17. The method of claim 15, wherein the first escape line, the second escape line, the first bump pad, and the second bump pad are co-planar.

18. The method of claim 15, wherein the first line, the second line, the first escape line and the second escape line have a same line spacing in the first plane.

19. The method of claim 15, wherein the photo-imageable dielectric layer separates a fine line/spacing, L/S, region from a solder connection region.

20. The method of claim 15, wherein the photo-imageable dielectric layer does not contain any reinforcement material or prepreg material.

21. The method of claim 15, further comprising incorporating the substrate into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

22. A non-transitory computer-readable medium comprising instructions that when executed by a processor cause the processor to perform a method, the method comprising:

providing a modified semi-additive process (mSAP) patterned substrate;

forming a first landing pad on a first side of the mSAP patterned substrate;

forming a second landing pad on the first side of the mSAP patterned substrate proximate to the first landing pad;

forming a first escape line on the first side of the mSAP patterned substrate between the first landing pad and the second landing pad;

forming a second escape line on the first side of the mSAP patterned substrate proximate to the first escape line between the first landing pad and the second landing pad;

forming a photo-imageable dielectric layer on the first side of the mSAP patterned substrate, the photo-imageable dielectric layer configured to encapsulate the first escape line and the second escape line;

forming a first bump pad on the photo-imageable dielectric layer opposite the mSAP patterned substrate, the first bump pad extending through the photo-imageable dielectric layer to the first landing pad; and forming a second bump pad on the photo-imageable dielectric layer opposite the mSAP patterned substrate, the second bump pad extending through the photo-imageable dielectric layer to the second landing pad, wherein a first line, a second line, the first escape line and the second escape line are co-planar in a first plane, and the first landing pad and the second landing pad are co-planar in a second plane different from the first plane, and wherein the first landing pad is coupled to the first line and the second landing pad is coupled to the second line.

23. The non-transitory computer-readable medium of claim 22, further comprising forming a solder resist film on the photo-imageable dielectric layer, the solder resist film configured to encapsulate the first bump pad and the second bump pad.

24. The non-transitory computer-readable medium of claim 22, wherein the first escape line, the second escape line, the first bump pad, and the second bump pad are co-planar.

25. The non-transitory computer-readable medium of claim 22, wherein the first line, the second line, the first escape line and the second escape line have a same line spacing in the first plane.

26. The non-transitory computer-readable medium of claim 22, wherein the photo-imageable dielectric layer separates a fine line/spacing, L/S, region from a solder connection region.

27. The non-transitory computer-readable medium of claim 22, wherein the photo-imageable dielectric layer does not contain any reinforcement material or prepreg material.

28. The non-transitory computer-readable medium of claim 22, further comprising incorporating the mSAP patterned substrate into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

\* \* \* \* \*